United States Patent
Berberich et al.

(10) Patent No.: US 7,684,165 B2
(45) Date of Patent: Mar. 23, 2010

(54) CIRCUIT ELEMENT AND METHOD FOR PROTECTING A LOAD CIRCUIT

(75) Inventors: Sven Berberich, Erlangen (DE); Martin Maerz, Nuremberg (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 200 days.

(21) Appl. No.: 11/562,364

(22) Filed: Nov. 21, 2006

(65) Prior Publication Data

US 2007/0159745 A1    Jul. 12, 2007

Related U.S. Application Data

(63) Continuation of application No. PCT/EP2005/005360, filed on May 17, 2005.

(30) Foreign Application Priority Data

May 24, 2004    (DE) .................. 10 2004 025 420

(51) Int. Cl.
    *H02H 5/04* (2006.01)
(52) U.S. Cl. .................. 361/103; 361/104; 257/209; 257/259
(58) Field of Classification Search ............... 361/103, 361/93.1, 104, 41; 257/209, 259
See application file for complete search history.

(56) References Cited

U.S. PATENT DOCUMENTS

| | | | | |
|---|---|---|---|---|
| 4,533,896 A * | 8/1985 | Belopolsky | ............... | 337/232 |
| 5,003,371 A * | 3/1991 | Tailliet et al. | ............... | 257/665 |
| 5,561,344 A | 10/1996 | Hsi | | |
| 5,675,468 A * | 10/1997 | Chang | ............... | 361/119 |
| 5,730,608 A * | 3/1998 | Legrady | ............... | 439/78 |
| 5,757,599 A | 5/1998 | Crane | | |
| 6,147,396 A | 11/2000 | Troger et al. | | |
| 6,323,111 B1 * | 11/2001 | Hui et al. | ............... | 438/467 |
| 6,331,763 B1 | 12/2001 | Thomas et al. | | |
| 6,509,624 B1 * | 1/2003 | Radens et al. | ............... | 257/530 |
| 6,631,066 B1 * | 10/2003 | Smith et al. | ............... | 361/103 |
| 6,735,065 B2 * | 5/2004 | Graf et al. | ............... | 361/103 |
| 2002/0070393 A1 | 6/2002 | Hui et al. | | |

FOREIGN PATENT DOCUMENTS

DE    198 05 785 C1    6/1999

\* cited by examiner

*Primary Examiner*—Stephen W Jackson
*Assistant Examiner*—Zeev Kitov
(74) *Attorney, Agent, or Firm*—Michael A. Glenn; Glenn Patent Group

(57) ABSTRACT

A circuit element for protecting a load circuit includes a signal input for applying a signal, a signal output, a signal path connecting the signal input to the signal output, and an interruption means for irreversibly interrupting the signal path upon the reception of a control signal at the same.

9 Claims, 9 Drawing Sheets

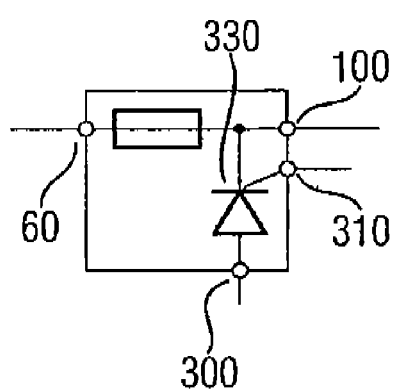
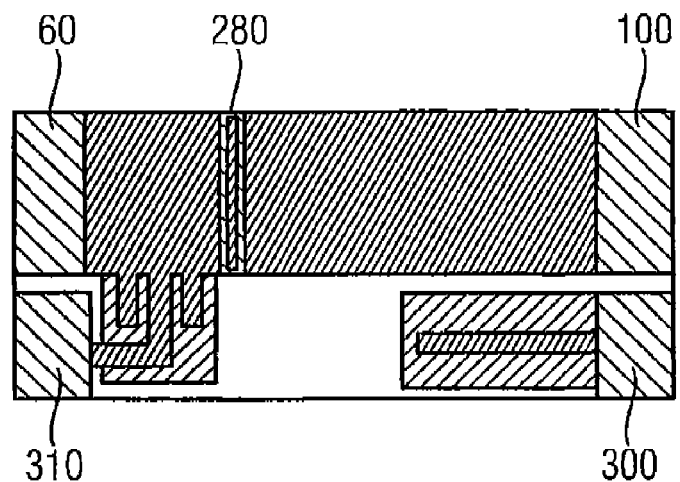
FIG 10A
FIG 10B
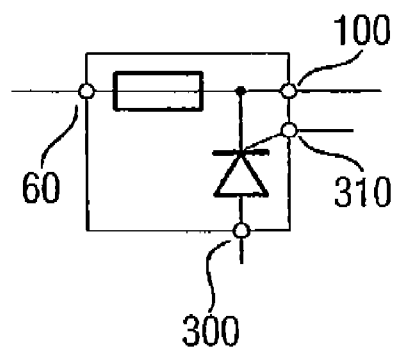
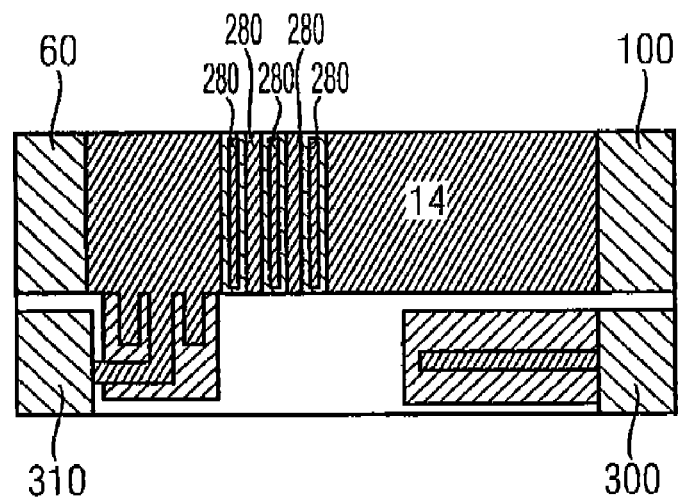
FIG 11A
FIG 11B

CIRCUIT ELEMENT AND METHOD FOR PROTECTING A LOAD CIRCUIT

CROSS-REFERENCE TO RELATED APPLICATION

This application is a continuation of co-pending International Application No. PCT/EP2005/005360, filed May 17, 2005, which designated the United States and was not published in English and is incorporated herein by reference in its entirety.

BACKGROUND OF THE INVENTION

1. Field of the Invention

The present invention relates to a circuit element and a method for protecting a load circuit.

2. Description of the Related Art

An object becoming more and more important in electronics, especially under safety aspects, consists in how individual devices or circuit parts can be shut down in targeted, permanent and as-inexpensive-as-possible manner, so as to prevent greater consequential damage.

This topic is to be examined in greater detail on the basis of two embodiments according to the prior art.

Today, power semiconductors are employed to a great extent for switching electric loads, such as lamps, valves, motors, heating elements, etc., but increasingly also in the field of power management for switching off individual circuit parts, e.g. to reduce the energy consumption of battery-operated devices. The two typical arrangements of switch and load are illustrated in FIG. 12 and FIG. 13.

FIG. 12 shows a so-called low-side switch. A voltage terminal 5, a switch 10, which is embodied as a field-effect transistor here, for example, a load 20, a fuse 30, and a course of the load current 40 are illustrated.

Since the switch 10 lies in the plus line to the ground line, it is considered as a low-side switch. Here, it is important for low loss power in the switch 10 that the switch has by far lower electric resistance in the on-state than the load 20. FIG. 13 shows a high-side switch. The switch 10 here lies in the plus line to the load 20. This is the only difference as opposed to the low-side switch illustrated in FIG. 12.

It also applies to the high-side switch that the loss power in the switch 10 should be low compared with the power in the electric resistor, which here forms the load 20, which means that the resistance of the switch 10 should be low compared with the resistance of the load 20.

Power MOSFETs have largely prevailed as electronic switches for these voltage applications. In the last few years, a very rapid development toward ever-lower pass resistivities, which can be seen from the calculation $R_{ds(on)}XA$, with $R_{ds(on)}$ representing the pass resistivity and A symbolizing the area, has made it possible that today currents of many amperes are manageable with semiconductor switches directly mounted on the circuit board without special cooling measures.

But one problem arises when complete switch-on no longer takes place through faults in the semiconductor switch or in its control. The switch then no longer reaches its low nominal pass resistance, so that the loss power in the switch also increases very strongly. In the worst case of the power matching, i.e. when the pass resistance of the switch comes into the range of the value of the load resistance, the loss power in the switch may reach up to one fourth of the nominal load power. An example can make this clearer:

In a power MOSFET with a pass resistance of 10 mΩ, which is employed as a switch for a load of 120 watts at 12 volts, a loss power of 1 watt develops in the nominal operation. The cooling of the MOSFET will be designed for this loss power in a concrete circuit.

In the embodiment of the prior art, if the pass resistance, however, increases by a fault, which may for example occur in the control, the loss power in the switch may reach values of up to 40 watts. With a cooling designed for 1 watt, this will very quickly lead to dangerously high temperatures up to a fire hazard of the circuit board, for example. Common protection elements, such as fuses 30, cannot compensate for this fault case, because no overcurrent of any kind occurs.

The load 20 always limits the current 40 to a value not exceeding the nominal operating current. Arbitrary monitoring circuits, which detect this fault, also would not be of any help here, because switch-off of the load current by means of the power switch would no longer be possible at every assumed defect in the control circuit or in the power switch.

FIG. 14 explains a further embodiment according to the prior art. The voltage terminal 5, the fuse 30, a varistor 50, a multilayer ceramic capacitor 60 and a tantalum electrolytic capacitor 70 are illustrated. FIG. 14 shows a series connection of the fuse 30 with a parallel connection including the varistor 50, the multilayer ceramic capacitor 60 and the tantalum electrolytic capacitor 70. The safety-critical devices, such as the varistor 50, the multilayer ceramic capacitor 60 and the tantalum electrolytic capacitor 70, are directly present at the supply voltage 5 via the fuse 30. In the operational state, these devices have a negligible leakage current at the nominal operating voltage, and hence a negligible static loss power. But if the leakage current increases in the fault case, or if a plate contact occurs especially in multilayer ceramic capacitors due to mechanical stress, the static loss power increases very strongly and may lead to extreme overheating of the device.

Especially in larger, centrally protected assemblies, there is the problem that although the current occurring in this fault case is sufficient to generate extreme overtemperatures with fire hazard locally, the current does not rise high enough to make the central protection element trigger, which is implemented in the fuse 30 here. The varistor 50, the multilayer ceramic capacitor 60 and the tantalum electrolytic capacitor 70 in this embodiment only symbolically represent a series of further devices very likely to become low-ohmic at the end of their life at overload or premature failure. All theses devices pose a risk with reference to the above-mentioned facts.

In this connection, a disadvantage of the prior art again becomes obvious that here an externally activable protection element is missing, which would enable separating safety-critical devices from electric voltage in targeted manner. In numerous cases, with this at least an emergency operation functionality of an assembly could be maintained.

According to the prior art, largely fuses can be employed for protection against damage by too high currents. These may also be obtained in most varied constructions and trigger characteristics. At the same time, even as overcurrent protection, there are cold conductors, such as PTC elements, finding broad application on ceramic or polymer basis, such as a poly switch™. But if such a fault case that no overcurrent occurs happens, as described above, these fuses are not suited as protection elements. These fuses are also not suited for the protection of safety-critical devices due to their constructive size, costs and trigger characteristics. In capacitors, for example, the AC operating current may lie significantly above the DC trigger current to be demanded, a requirement that cannot be met with a classic fuse.

Apart from that, in embodiments according to the prior art, also temperature sensors are employed to monitor circuits with respect to temperatures. But this kind of monitoring also cannot offer protection in the described case of a defective, no longer controllable semiconductor. The recognition of an overtemperature is of no use here, since the current flow can indeed no longer be interrupted by intervention into the control voltage of the defective switch. This also poses a high risk for the assemblies to be protected.

A further variant according to an embodiment of the prior art consists in the employment of a crowbar switch. A crowbar switch is a powerful short switch capable of triggering a present central fuse. Due to the high costs and the required space need, crowbar solutions in embodiments according to the prior art are not suitable for decentralized protective measures. A central crowbar very strongly limits the possible fields of application, since in many applications it is not tolerable to shut down the entire system instead of only a single load current path in the fault case.

U.S. Pat. No. 5,003,371 teaches a circuit element with a fuse, an input pin and an output pin. The input pin and the output pin are connected to each other via doped zones. The doped zones are arranged so that a thyristor or field-effect transistor are formed. The thyristor may be ignited by a positive signal at a gate of the field-effect transistor. Following igniting of the thyristor, the thyristor effects melting of the fuse.

U.S. Pat. No. 5,757,599 teaches a protection element in a circuit device. The protection element is connected in parallel to the circuit device. If the operating parameters of the circuit device are exceeded, the protection element causes a short of the circuit device by an irreversible short in a thyristor.

DE 19805785C1 teaches a power semiconductor module, in which a power semiconductor device is connected in electrically conducting manner via output lines. The power semiconductor module comprises interruption means irreversibly interrupting the output lines if a predetermined operating temperature threshold is exceeded. The interruption means is characterized by a volume-expanding or exploding characteristic.

SUMMARY OF THE INVENTION

It is an object of the present invention to provide a circuit element for protecting a load circuit and a method of protecting a load circuit, which enable safely interrupting a current path.

In accordance with a first aspect, the present invention provides a circuit element for protecting a load circuit, having: a signal input for applying a signal; a signal output; a signal path connecting the signal input to the signal output and leading via a trace arranged on a main surface of a semiconductor substrate and bordering on a first heat-dissipating region and a second heat-dissipating region, wherein the heat dissipation of the second heat-dissipating region is worse than the heat dissipation of the first heat-dissipating region, wherein the second heat-dissipating region includes a trench region in the semiconductor substrate, which is formed such that the trace is meltable over the trench region by local heating above the trench region by the poor heat dissipation thereof, and wherein the trench region defines a cavity below the trace, the dimension of which in a direction perpendicular to the main surface of the semiconductor substrate, on which the trace is arranged, is greater than its dimension in a direction of the extension of the trace, so that the cavity acts as a capillary for sucking off the molten trace material; and an interrupter for irreversibly interrupting the signal path upon the reception of a control signal at the same.

In accordance with a second aspect, the present invention provides a chip including a circuit element for protecting a load circuit, having: a signal input for applying a signal; a signal output; a signal path connecting the signal input to the signal output and leading via a trace arranged on a main surface of a semiconductor substrate and bordering on a first heat-dissipating region and a second heat-dissipating region, wherein the heat dissipation of the second heat-dissipating region is worse than the heat dissipation of the first heat-dissipating region, wherein the second heat-dissipating region includes a trench region in the semiconductor substrate, which is formed such that the trace is meltable over the trench region by local heating above the trench region by the poor heat dissipation thereof, and wherein the trench region defines a cavity below the trace, the dimension of which in a direction perpendicular to the main surface of the semiconductor substrate, on which the trace is arranged, is greater than its dimension in a direction of the extension of the trace, so that the cavity acts as a capillary for sucking off the molten trace material; and an interrupter for irreversibly interrupting the signal path upon the reception of a control signal at the same.

The present invention provides a circuit element with a signal input for applying a signal, a signal output, a signal path connecting the signal input to the signal output, and an interruption means for irreversibly interrupting the signal path upon reception of a control signal at the same.

Moreover, the present invention provides a method of protecting a load circuit, including receiving a control signal and irreversibly interrupting a signal path between an input and an output of a circuit element upon the reception of the control signal.

The present invention is based on the finding that a current on a signal path between an input and an output of a circuit element can be superimposed with a further current upon the reception of a control signal so that the signal path is interrupted.

A circuit element or protection element according to the present invention has significant advantages. It uniquely combines the advantage of a fuse, which has a very low resistance of the intact protection path, with the controllability of semiconductor switches. The insertion resistance in one embodiment of the present invention may be lowered comparably easily to values of few mΩ and below, values not even achievable in the least with any switch-off-capable semiconductor structure known today at comparable chip area and comparable costs. By a crowbar structure or protection circuit structure integrated on the circuit element or protection element, very simple controlled triggering of a protection circuit element or protection is possible.

In an advantageous implementation according to an embodiment of the present invention, even the control input is microprocessor-compatible with reference to input resistance and voltage level. The particular advantage lies in the fact that by means of the microprocessor only dedicated parts of a circuit can be shut down, wherein an emergency operation functionality of a circuit to be protected can be maintained further.

In a further embodiment according to the present invention, also a temperature-dependent, self-triggering circuit element for protecting a load circuit may be attached spatially close to a device to be protected, such as a switch in one embodiment according to the present invention. At the presence of a fault, if the temperature at the circuit element for protecting a load circuit reaches the triggering temperature here, the circuit element for protecting the load circuit or the protection element safely and permanently disconnects the current path and thereby avoids further damage in the system, such as fire damage, in particular.

The great flexibility of the present invention can also be seen in that, in further embodiments of the present invention, the circuit elements for protecting a load circuit can be activated by a plurality of monitoring circuits. For example, a monitoring circuit may for this purpose detect fault states in the system directly by current or voltage measurements or indirectly via infrared (IR) heat radiation or temperature sensors, and then disconnect individual load current paths, capacitor blocks or other safety-critical circuit parts, as implementable in embodiments according to the present invention, reliably and permanently from the voltage supply by controlling the protection element or the circuit element for protecting the load circuit.

Here, in an embodiment according to the present invention, the great flexibility of the circuit elements for protecting a load circuit according to the present invention can also be seen. In the monitoring circuits, advantageously also microprocessors can be used, which then even perform plausibility checks of the fault signals and thus reduce or minimize the danger of fault triggerings. In a suitable implementation according to an embodiment of the present invention, also intelligent reaction strategies to faults thus are possible, such as a power reduction in a power supply unit after switching off individual defective filter capacitors, or even the functional replacement of a failed rear light channel of motor vehicles by a dimmed breaking light, which is made possible in a further embodiment according to the present invention.

At the same time, by the present invention, the costs of the operation of an entire system, parts of which are protected by a circuit element according to the present invention, can be saved. Advantageously, in one embodiment of the present invention, for example, an overvoltage protection of particularly high-quality and expensive circuit elements or circuit parts can be realized. Like a classic fuse against overcurrents, here a circuit element for protecting a load circuit according to the present invention protects against overvoltage damage of only one entirely dedicated circuit part, which is particularly expensive. Then, after responding, like in a classic fuse, exchanging the circuit element for protecting the load circuit is required in order to again operate the particularly high-quality dedicated circuit part to be protected.

Moreover, in a further embodiment according to the present invention, the circuit element for protecting a load circuit may even be integrated on a chip and protect predetermined parts of the circuit structure on this chip, while other parts of the circuit structure on the chip ensure an emergency operation functionality. This underlines the comprehensive applicability of the present invention in the integrated circuit structure technology.

In addition, the protection element according to the present invention may both be realized as a discrete electronic device and be integrated in an integrated circuit. Since the protection element in one embodiment according to the present invention can be integrated on a chip including further circuit structures, hereby also the number of components in an overall system can be reduced, whereby the costs can be reduced.

A further advantage of the present invention consists in the flexibility of the triggering mechanisms with which a protection element according to the present invention can be activated. This may either be done via a signal present at the control input or by evaluation of certain physical quantities, such as ambient temperature or supply voltage.

Moreover, a protection element according to the present invention may be realized monolithically in silicon, which leads to correspondingly small geometrical dimensions and enables inexpensive fabrication in great numbers.

BRIEF DESCRIPTION OF THE DRAWINGS

These and other objects and features of the present invention will become clear from the following description taken in conjunction with the accompanying drawings, in which:

FIGS. 10a, 10b show a further embodiment according to the present invention and its implementation on a semiconductor substrate;

FIGS. 11a, 11b show a further implementation form of the embodiment from FIGS. 10a, 10b on a semiconductor substrate;

DESCRIPTION OF THE PREFERRED EMBODIMENTS

Figure 1:
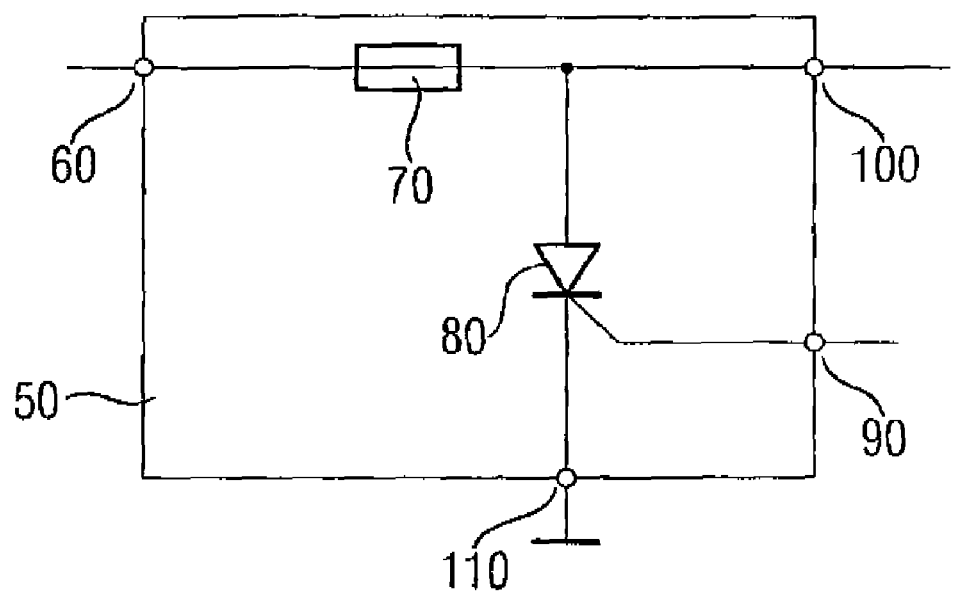
FIG. 1 shows a circuit element according to an embodiment of the present invention.

FIG. 1 shows a protection circuit element against ground 50, which is implemented according to an embodiment of the present invention. It includes an input 60, an interruption element 70, a trigger element 80, a control signal 90, an output 100 and a ground terminal 110. The input 60 is connected to the output 100 via the interruption element 70, wherein the output 100 is attached to the ground terminal 110 via the trigger element 80. The control signal input 90 comprises a conducting connection to the trigger element 80.

The interruption element 70 disconnects the signal path between the input 60 and the output 100, when the trigger element 80 becomes correspondingly low-ohmic, and thus leads to a high current across the interruption element 70. The behavior of the trigger element 80 is controlled by a control signal at the control signal input 90. Thus, between the power terminals 60 and 100, a protection path is inserted with the interruption element 70. The trigger element 80 may for example be embodied as electronic switch between the load-side power terminal or output 100 and the ground terminal or further power terminal 110 and enable disconnecting the protection path between the input 60 and the output 100, and hence safe interruption of the current path. If a control signal is present at the control signal input 90, the resistance of the trigger element 80 decreases, which leads to an increase in the current through the interruption element 70. The interruption element 70 then heats up by this current increase until it destroys itself by this heating.

As switch or trigger element 80, for example, a thyristor structure or also bipolar transistor structures, as well as a Darlington circuit or also MOSFET or IGBT structures, and even any other current-amplifying semiconductor structures may be employed.

In this embodiment of the present invention, the ground terminal 110 is connected to a voltage potential lying below the potential at the input 60 by at least a few volts, but maximally by a bit less than the breakdown voltage of the switch 80. The voltage between the input 60 and the ground terminal 110 has to be so stable dynamically that triggering is possible on the protection path in the interruption element 70. Advantageously, in this embodiment of the present invention, the ground terminal 110 is connected to the circuit ground or GND.

Figure 2:
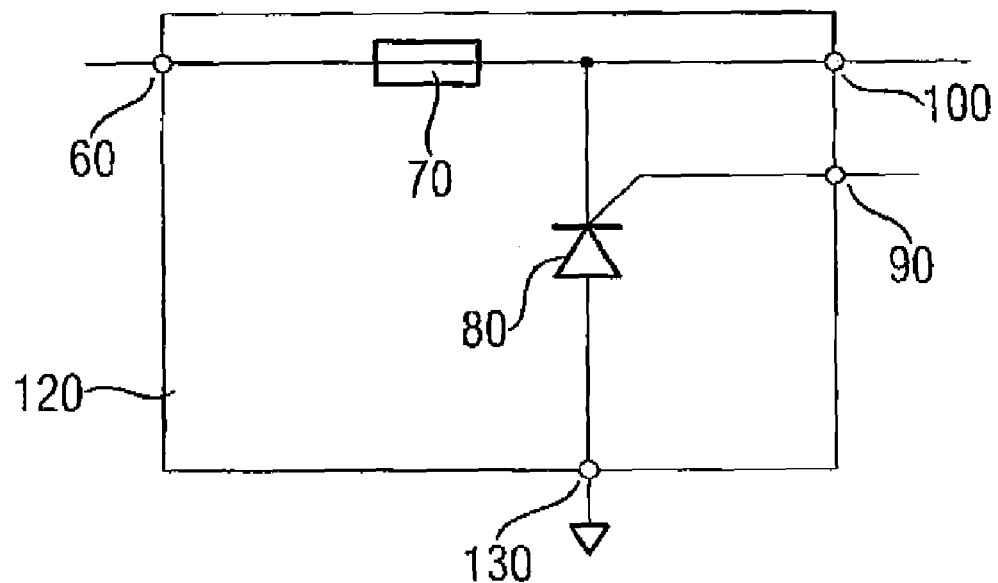
FIG. 2 shows a further circuit element according to the present invention.

In FIG. 2, a further embodiment according to the present invention is illustrated. The protection circuit element 120 shown here against supply voltage differs from the embodiment shown in FIG. 1 in that the trigger element 80 lies between the output 100 and the supply voltage terminal 130. Hereby, of course also the polarity of the trigger element 80 is to be adapted correspondingly.

Figure 3:
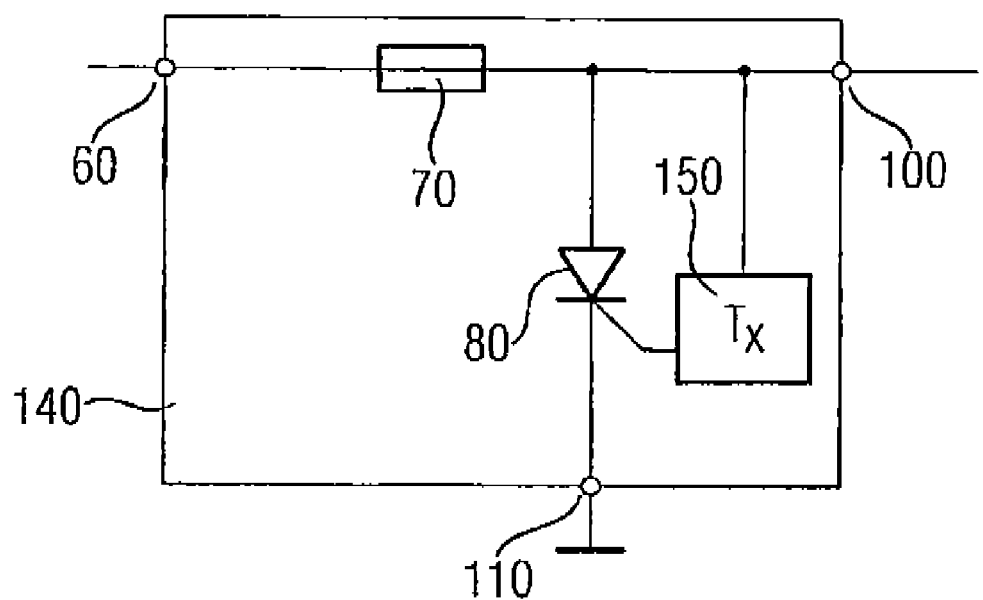
FIG. 3 shows a circuit element according to the present invention with a temperature sensor.

FIG. 3 illustrates a further embodiment according to the present invention, which comprises a temperature protection circuit element 140. Here, the control of the trigger element 80 is done via a temperature sensor 150 present at the output 100, in contrast to the embodiment shown in FIG. 1. Depending on the resistance of the temperature sensor 150, the voltage of the control signal at the trigger element 80 changes and leads to the fact that the trigger element 80 activates the interruption element 70 upon exceeding of a certain threshold. As temperature sensor, for example, a pn diode path may be used, or a thyristor may also be employed as switch or trigger element 80, wherein the thyristor may be dimensioned so that self-igniting, which corresponds to so-called overhead igniting, occurs at a required trigger temperature.

Figure 4:
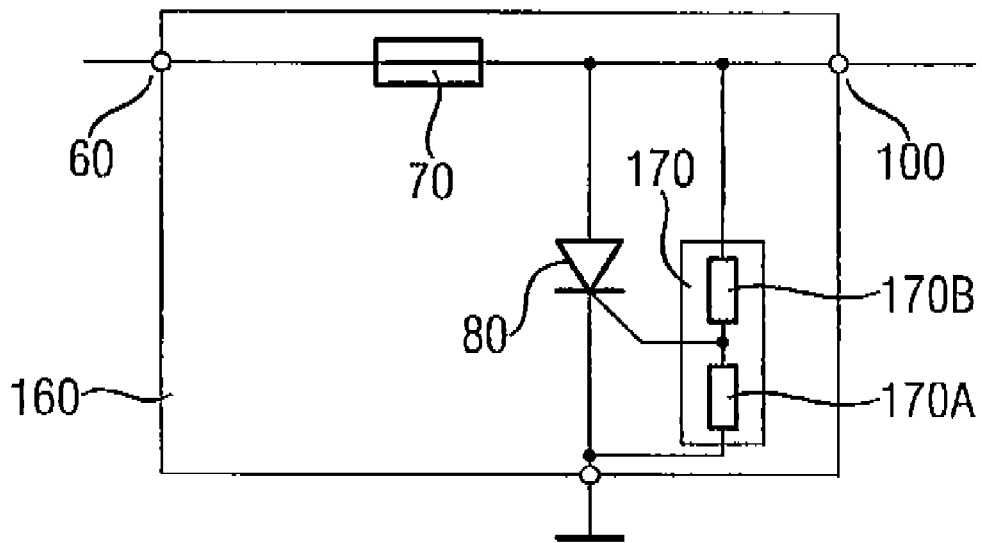
FIG. 4 shows a circuit element according to the present invention, which is triggered via an input signal of a voltage divider circuit.

FIG. 4 shows a further embodiment according to the present invention, which here is employed in an overvoltage protection element 160. The temperature sensor 150 from the embodiment in FIG. 3 is replaced by a voltage divider circuit 170 including a first series resistor 170a and a second series resistor 170b. The voltage is tapped at a point between the series resistors 170a and 170b.

Here, the output voltage at the output 100 is monitored and upon exceeding a maximum voltage between the output 100 and the ground terminal 110, via the control signal, the trigger element 80 is activated, which causes the interruption element 70 to interrupt the signal path or the protection path between the input 60 and the output 100.

Figure 5:
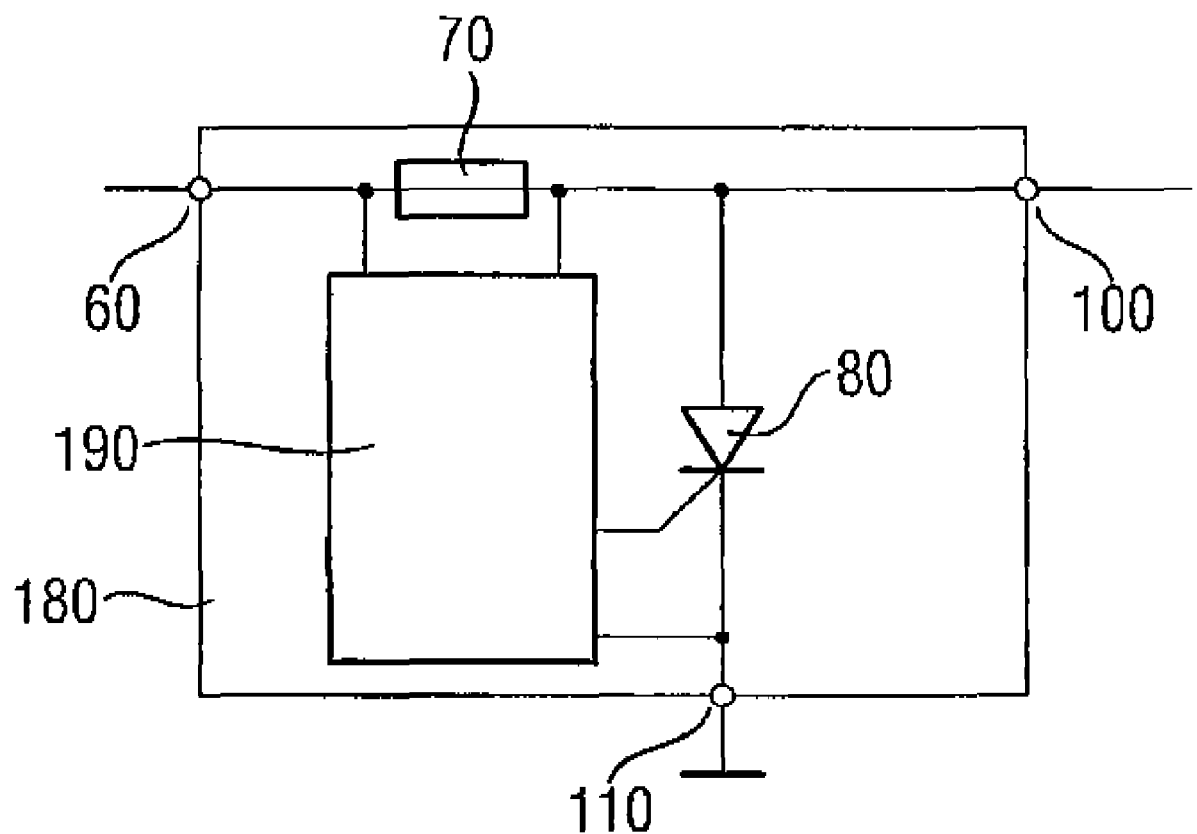
FIG. 5 shows a circuit element according to an embodiment of the present invention, which is triggered upon exceeding a predetermined current threshold.

FIG. 5 shows a further embodiment of the present invention, which here is employed as overcurrent protection element 180. Unlike in the overvoltage protection element 160 in FIG. 4, here the control of the trigger element 80 is done via a voltmeter 190. The voltmeter 190 determines a voltage present at the interruption element 70 and here makes use of the fact that the voltage dropping at the interruption element 70 is proportional to the current flowing in the interruption element 70. Thus, a voltage drop at the protection path or the interruption element 70 is determined, which serves as current measuring resistor when the protection path is intact, and then is evaluated.

If the current value exceeds a preset current value, controlling the trigger element 80 takes place, and hence triggering the protection path or the interruption element 70. If the current exceeds a preset current value, the resistance of the trigger element 80 decreases, which leads to an increase of the current through the interruption element 70. The interruption element 70 then heats up by this current increase until it destroys itself by this heating.

By depositing corresponding characteristics in the evaluation and control circuit and/or the voltmeter 190, almost any trigger characteristics can be realized in this active circuit element for protection.

Figure 6:
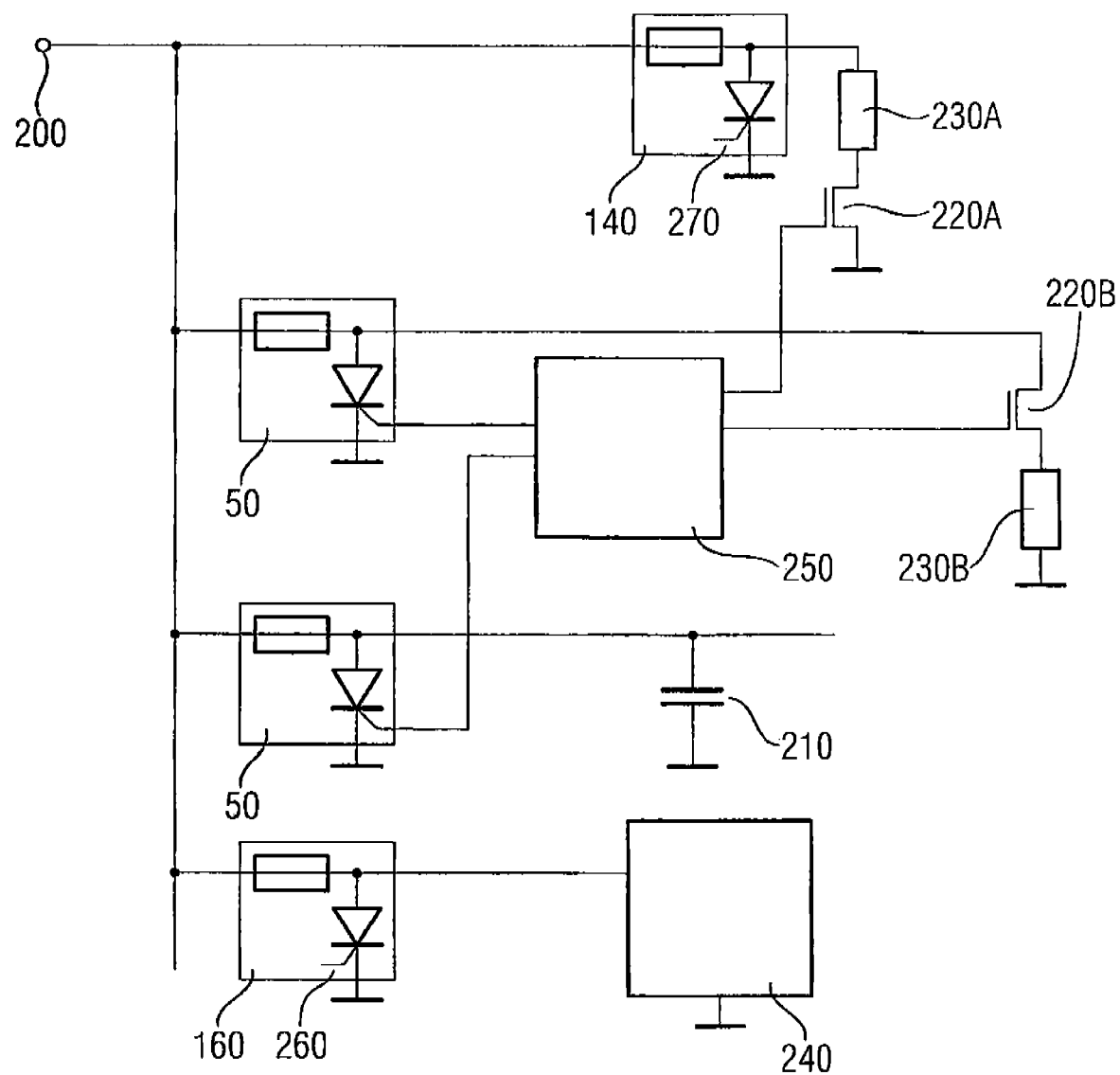
FIG. 6 shows a circuit protected by circuit elements according to the present invention.

FIG. 6 explains how embodiments of the present invention may be employed in a device. There, two protection circuit elements 50 against ground, the overvoltage protection element 160 and the temperature protection circuit element 140 are employed. The voltage supply is done via the voltage input at the device 200. All circuit elements for protecting 50, 140, 160 are present directly at the supply voltage input 200. A microprocessor 250 provides the control signal for the protection circuit elements 50, the output of which each provides for the voltage supply of a load 130b and of a capacitor 210.

If the microprocessor recognizes a critical state of the circuit structures, it makes the protection circuit elements 50 interrupt the connection to the load 230b or to the capacitor 210. At the same time, the microprocessor 250 also controls the load 230b via the switch 220b.

At its output, the temperature protection circuit element 140 provides the load 230a with a voltage and protects it depending on a temperature sensor signal 270. If the temperature at the load 230a exceeds a critical value, the temperature sensor signal 270 changes and causes the temperature protection circuit element 140 to interrupt the supply of the load 230a. At the same time, the load 230a is controlled from the microprocessor 250 via the switch 220a.

In s device employing the embodiments of the present invention, a high-quality circuit structure 240 is protected by the overvoltage protection element 160. The overvoltage protection element 160 obtains a voltage divider input signal 260, whereby it is ensured that the voltage at the high-quality circuit 240 never exceeds a critical value.

Figure 7:
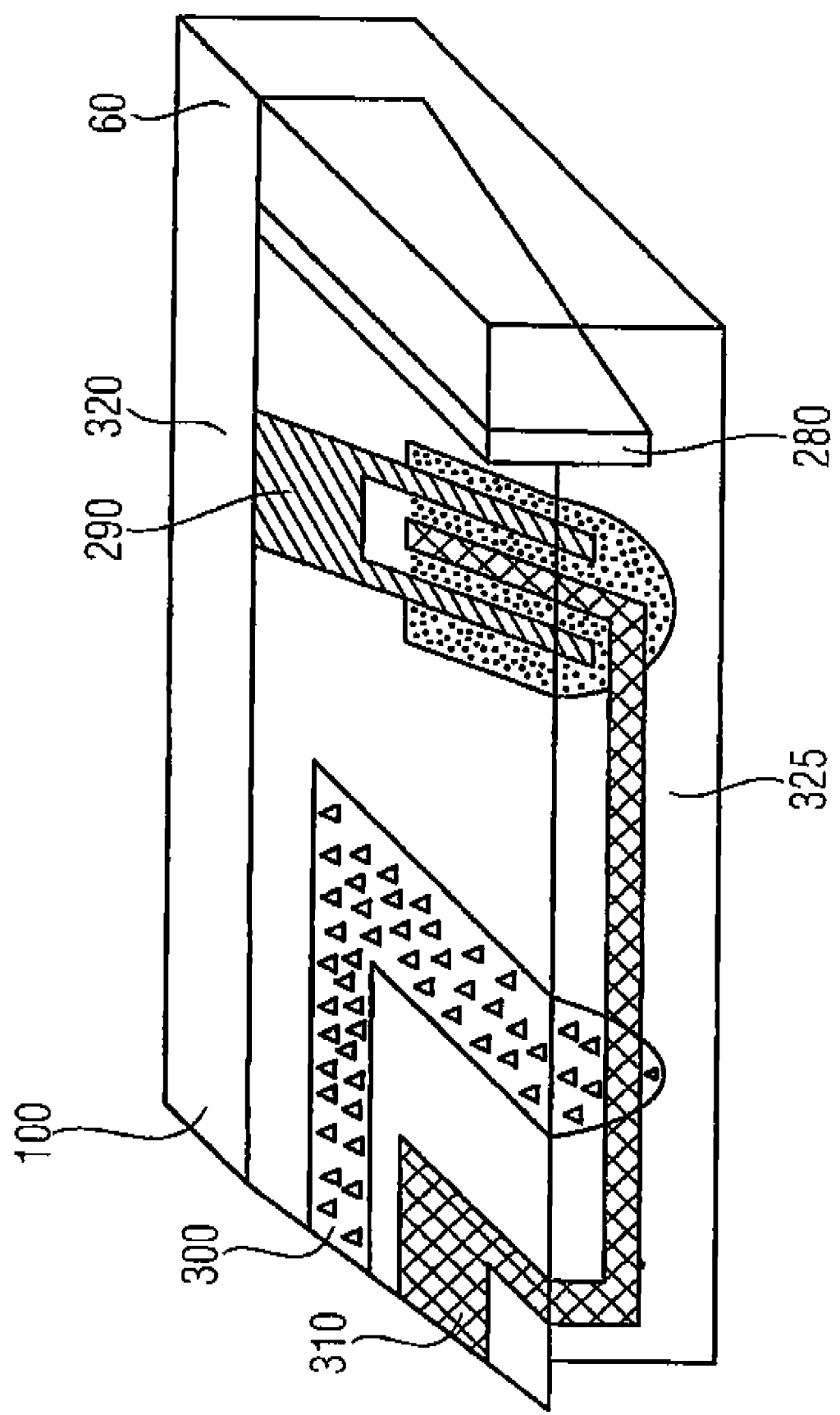
FIG. 7 shows an implementation of an embodiment according to the present invention on a semiconductor substrate.

FIG. 7 shows an implementation of the embodiment according to the present invention illustrated in FIG. 1. This is a circuit element monolithically constructed on a silicon chip, wherein the circuit element is applied on the semiconductor substrate 325. An arrangement with a lateral thyristor as switch or trigger element 80 is illustrated here. The interruption element 70 here consists of a trench 280 or a trench structure partially passing below a trace 320 between the input 60 and the output 100. The interruption element 70 including the protection path or the portion of the trace 320 between the input 60 and the cathode 290 is completely undermined with the trench structure or the trench 280 directly next to the crossing point of the trace 320 and the metallization of the trigger element 80 or the switch embodied as thyristor here.

Thus, the described arrangement includes, apart from an active device employed as trigger element 80 here, a trench structure 280 and a trace 320, which form the interruption element or protection path. This arrangement may either be realized as a discrete device or also be monolithically integrated on the semiconductor chip. With this, safe interruption of a current path can also be realized directly on a chip.

In the trigger case, the trigger element 80 leads to a current between the terminals 100 and the anode 300, which overlays the operating current between the terminals 60 and 100 in the region of the interruption element 70. By the sum of both currents, the trace is made to melt over the trench 280.

The trench structure 280 drawn in the cross sectional sketch and producing a cavity below the trace on the one hand serves the purpose that local heating exactly above the trench 280 follows the activation of the trigger structure, since air in this cavity dissipates the developing heat very badly. On the other hand, the narrow trench 280 acts like a capillary and thus provides for safe mechanical disconnection of the trace by sucking off the liquid material into the trench.

The protection element according to an embodiment of the present invention described here may for example be produced on silicon semiconductor material.

It includes the power switch having the gate 310, the anode 300 and the cathode 290, and the trench structure 280, which supports interrupting the trace 320 between the terminals 60, 100 as part of the interruption element. The interruption element 70 is realized by taking out a piece from the trace 320, which then falls into the trench 280.

Here, the thyristor includes a structure consisting of four zones of varying doping, n or p doping in the semiconductor. The doping sequence depends on the respective technology used, i.e. the doping type of the substrate material.

If n-doped substrate material 320 is used, the well below the cathode contact 290 and below the gate metallization 310 is p-doped. The wells below the anode contacts 300 are n-doped. When using p-doped substrate material, the n and p dopings previously mentioned are to be interchanged.

The power switch may also be embodied as a bipolar structure, as a Darlington circuit, as an MOSFET or IGBT structure, or any other current-amplifying semiconductor structures. These may be realized as vertical or horizontal devices. In the case of a power switch with MOSFET gate, this may be realized both as p channel and as n channel transistor. In case of using bipolar transistors, these may be embodied as npn or pnp structures.

The trench 280 may be produced with the aid of an anisotropic etching method, such as a dry etching method or KOH etching, which enables producing high aspect ratios, to obtain the capillary action of the trench. The trench may either be embodied as a single trench or as an arrangement of several trenches of equal or differing geometry.

The trench structure below a portion of the trace, which functions as protection path, or in the region of the interruption element 70 can also be realized by means of isotropic etching methods, such as the wet-chemical etching. The metallization traces are of aluminum or other metallic layers, such as copper, gold, platinum, silver, tungsten, lead, zinc, or of metallic alloys or other electrically conductive layers.

Figure 8A:
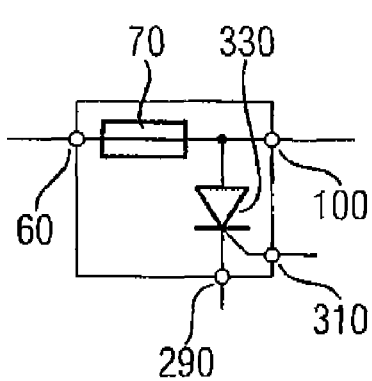
FIGS. 8a, 8b show an embodiment according to the present invention and an implementation thereof on a semiconductor substrate.

FIG. 8*a* explains an implementation of a circuit element for protecting a load circuit according to an embodiment of the present invention, wherein here the trigger element 80 is formed by a thyristor. The circuit element includes the input 60, the output 100, the anode of the thyristor 300 and the gate 310 of the thyristor 330. The current through the thyristor 330 is controlled via the gate 310, wherein the current through the thyristor 330 overlays with the current at the output 100.

When the current through the thyristor 330 exceeds a critical threshold, the current through the interruption element 70 begins heating the same, until it destroys itself.

Figure 8B:
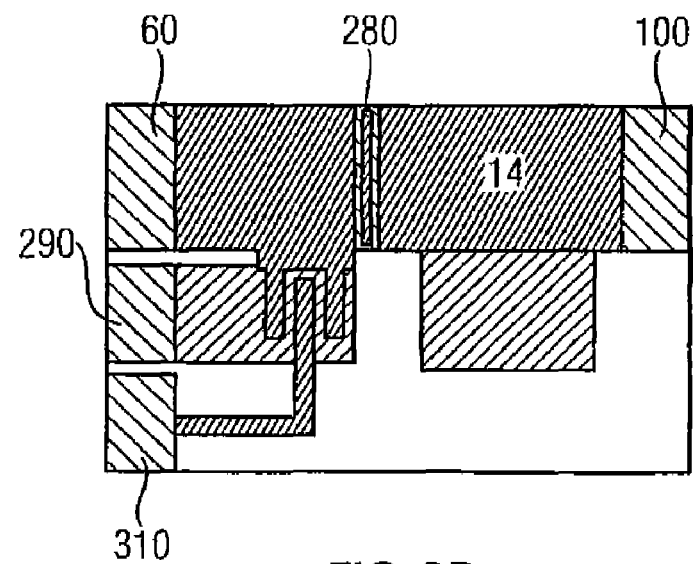

In FIG. 8*b*, an implementation of the circuit structure illustrated in FIG. 8*a* is explained, including the contacts 60, 100, 300, 310. The circuit element for protecting a load circuit may preferably also be employed as unpackaged implementation or as bond-wireless chip scale package. The contacting 60, 100, 300, 310 then preferably takes place in a flip-chip or BGA (ball grid area) technology. In the embodiment of the present invention, the connecting pads or connecting bumps 60, 100, 300, 310 are provided with solderable metal surfaces, so that the protection element can be soldered directly onto a circuit carrier, such as a circuit board, like a flip-chip device.

Figure 9A:
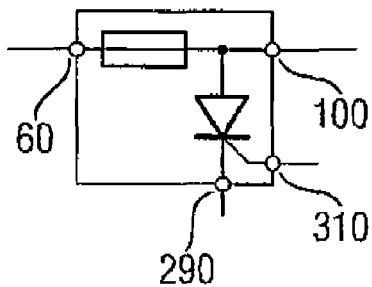
FIGS. 9a, 9b show a further implementation variant of the embodiment according to the present invention shown in FIGS. 8a, 8b with reference to the implementation on a semiconductor substrate.
Figure 9B:
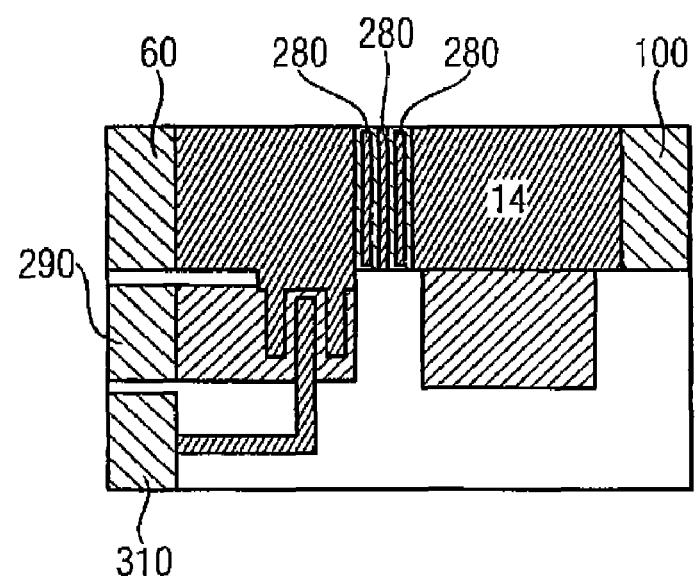
Figure 12:
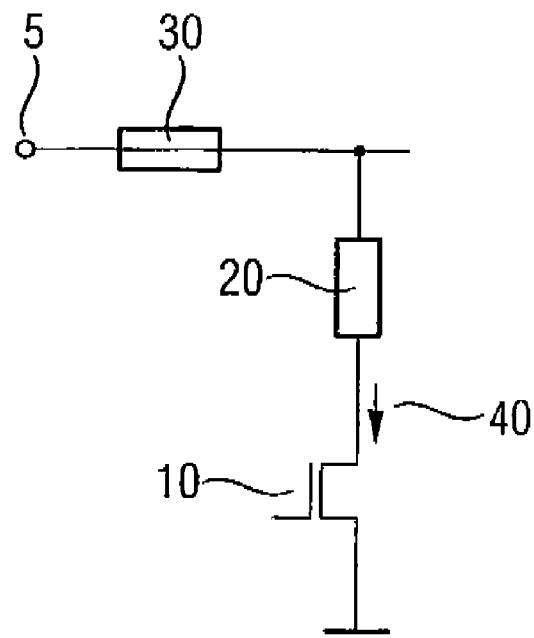
FIG. 12 shows use of a fuse as low-side switch in a circuit according to the prior art.
Figure 13:
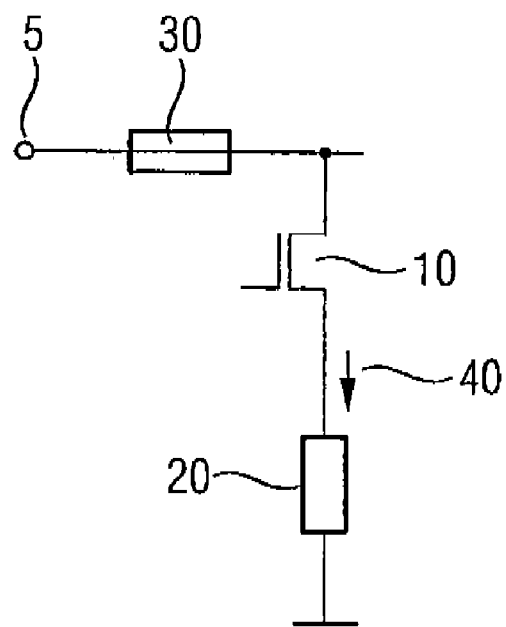
FIG. 13 shows use of a fuse as high-side switch in a circuit according to the prior art.
Figure 14:
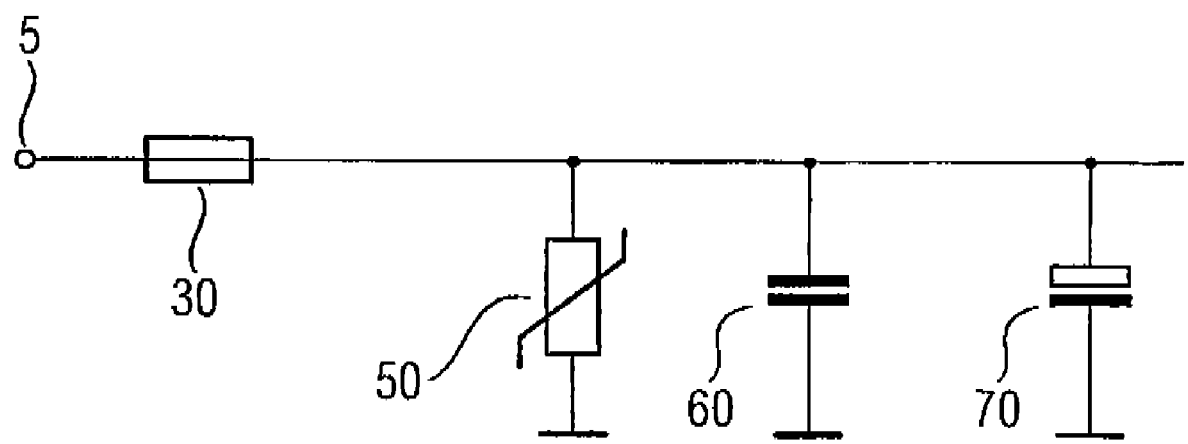
FIG. 14 shows a protection circuit in one embodiment according to the prior art.

FIG. 9*a* and FIG. 9*b* show a further implementation of the circuit structure according to an embodiment of the present invention shown in FIG. 8*a*. From FIG. 9*a*, it can be seen that the circuit structure includes the same functionality as the circuit shown in FIG. 8*a*. But from FIG. 9*b* it can be seen that the implementation on the semiconductor substrate has been changed. Instead of a single trench 280, like in FIG. 8*b*, three trenches 280 below the trace between the input 60 and the output 100 are introduced in the semiconductor structure according to FIG. 9*b*.

This makes the functionality of the interruption element 70 safer, since if disconnecting the trace above one of the three trenches 280 should not be done correctly, the two remaining trenches still remain to disconnect the traces in the manner intended.

FIG. 10*a* shows a further embodiment of the present invention differing from the circuit element for protecting a load in FIG. 8*a* in that all dopings in FIG. 10*a* are interchanged as compared with FIG. 8*a*. Hereby, the opposite polarity of the thyristor 330 results, which in turn is attached at the contacts 100, 290, 310.

FIG. 10*b* explains the implementation of the circuit structure shown in FIG. 10*a*, wherein it becomes obvious that the doping types are exactly opposite to the semiconductor structure of FIG. 8*b*.

The cathode 290 lies at the supply voltage, i.e. the thyristor or an active switch that has taken over the function of the trigger element lie at the supply voltage, such as a vehicle battery, wherein the supply voltage is greater than the voltage at the output 100. FIG. 11*a* again shows the same circuit structure as in FIG. 10*a*, with a plurality of trenches again being implemented in analog manner with respect to FIG. 9*b* in FIG. 11*b*. The plurality of trenches in this embodiment again increase the safety of triggering the interruption element 70.

Above embodiments have shown that in case of a defect of individual components of an electronic circuit it is the goal to prevent further damage, such as fire damage, by safe interruption of the current path. Above embodiments of the present invention may be employed in all fields of application of electronic circuits, in particular circuits with operating voltages in the low-voltage range, i.e. smaller than 25 volts.

Since above embodiments include a protection element, which may for example be fabricated on silicon basis and be inserted in the current path and furthermore interrupts in the fault case by itself or externally activated by the current flow, this system can be realized both in integrated manner and discretely.

Above embodiments have shown that a circuit element for protecting a load circuit or a protection element may be embodied on semiconductor basis with an electronic trigger mechanism, for example in discrete constructions consisting of protection element and electronic trigger mechanism. Preferably, this may be produced on silicon as substrate material, on silicon carbide as substrate material or silicon germanium as substrate material.

Moreover, above embodiments of the present invention have illustrated that the electronic trigger mechanism is embodied e.g. as thyristor, as varistor, as MOSFET, as IGBT or as bipolar transistor.

In above embodiments of the present invention, a protection element includes a current-conductive connection, below which there are one or more recesses in the substrate material. In above embodiments, these recesses may comprise air-filled cavities or be filled with an explosive or an expanding agent.

Above embodiments have shown that the recesses preferably have high aspect ratios, advantageously act like capillaries, and are produced by anisotropic etching processes, dry etching processes or wet-chemical etching processes. It is also advantageous when these recesses have poor thermal conductivity, In above embodiments of the present invention, the circuit elements for protecting a load circuit are preferably compatible with standard SMD packages and can preferably be mounted on circuit carriers with standard SMT processes.

The embodiments of the present invention may be embodied as circuit elements including a thyristor, in which overhead igniting occurs at a defined temperature, or an electric switch, which switches into conductance at a defined temperature.

In above embodiments of the present invention, a temperature sensor in the circuit element for protecting the load circuit may ignite a crowbar switch at a defined temperature, a voltage detection may ignite the crowbar switch upon reaching a voltage threshold, or a load current detection may ignite the crowbar switch upon reaching a current threshold value.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit element for protecting a load circuit, comprising:
   a signal input for applying a signal;
   a signal output;
   a signal path connecting the signal input to the signal output and leading via a trace arranged on a main surface of a semiconductor substrate and bordering on a first heat-dissipating region and a second heat-dissipating region,
   wherein the second heat-dissipating region includes a trench region in the semiconductor substrate, which is formed such that the trace is meltable over the trench region by local heating above the trench region by the poor heat dissipation thereof, and
   wherein the trench region defines a cavity below the trace, the dimension of which in a direction perpendicular to the main surface of the semiconductor substrate, on which the trace is arranged, is greater than its dimension in a direction of the extension of the trace, so that the cavity acts as a capillary for sucking off the molten trace material; and
   an interrupter for irreversibly interrupting the signal path upon the reception of a control signal at the same.

2. The circuit element for protecting a load circuit of claim 1, wherein the interrupter comprises a monitoring circuit for detecting a fault state on the basis of a current through the signal path and for generating the control signal based on the detected fault state, and an electric trigger mechanism, which causes, upon the reception of the control signal, a current through the signal path by which the signal path is irreversibly interrupted.

3. The circuit element for protecting a load circuit of claim 1, wherein the monitoring circuit comprises a voltage divider circuit.

4. The circuit element for protecting a load circuit of claim 3, wherein a signal input into the voltage divider circuit is dependent on a signal at the signal output of the circuit element.

5. The circuit element for protecting a load circuit of claim 1, wherein the monitoring circuit comprises a temperature sensor.

6. The circuit element for protecting a load circuit of claim 1, wherein the monitoring circuit comprises a current measurement circuit determining the current across the signal path.

7. The circuit element for protecting a load circuit of claim 1, wherein the interrupter includes a field-effect transistor, a bipolar transistor, a thyristor, a varistor, or an IGBT structure.

8. The circuit element for protecting a load circuit of claim 1, wherein the trace in an interruption region in the proximity of second heat dissipation region is formed so that it heats up by itself until the signal path is interrupted by the self-destruction of the trace arising as a result of the heating.

9. A chip including a circuit element for protecting a load circuit, comprising:
   a signal input for applying a signal;
   a signal output;
   a signal path connecting the signal input to the signal output and leading via a trace arranged on a main surface of a semiconductor substrate and bordering on a first heat-dissipating region and a second heat-dissipating region,
   wherein the second heat-dissipating region includes a trench region in the semiconductor substrate, which is formed such that the trace is meltable over the trench region by local heating above the trench region by the poor heat dissipation thereof, and
   wherein the trench region defines a cavity below the trace, the dimension of which in a direction perpendicular to the main surface of the semiconductor substrate, on which the trace is arranged, is greater than its dimension in a direction of the extension of the trace, so that the cavity acts as a capillary for sucking off the molten trace material; and
   an interrupter for irreversibly interrupting the signal path upon the reception of a control signal at the same.

* * * * *